(12) United States Patent
Chen et al.

(10) Patent No.: US 12,020,964 B2
(45) Date of Patent: Jun. 25, 2024

(54) CONTAMINATION CONTROL IN SEMICONDUCTOR MANUFACTURING SYSTEMS

(71) Applicant: Taiwan Semiconductor Manufacturing Co., Ltd., Hsinchu (TW)

(72) Inventors: Bo Chen Chen, Hsinchu (TW); Sheng-Wei Wu, Hsinchu County (TW); Yung-Li Tsai, Miaoli County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/700,041

(22) Filed: Mar. 21, 2022

(65) Prior Publication Data

US 2022/0208581 A1    Jun. 30, 2022

Related U.S. Application Data

(62) Division of application No. 16/435,751, filed on Jun. 10, 2019, now Pat. No. 11,282,728.

(Continued)

(51) Int. Cl.
*H01L 21/67* (2006.01)
*B08B 5/02* (2006.01)
*H01L 21/677* (2006.01)

(52) U.S. Cl.
CPC .......... *H01L 21/67288* (2013.01); *B08B 5/02* (2013.01); *H01L 21/67739* (2013.01)

(58) Field of Classification Search
None
See application file for complete search history.

(56) References Cited

U.S. PATENT DOCUMENTS

2003/0178046 A1    9/2003  Hou et al.
2004/0253824 A1    12/2004 Tegeder
(Continued)

FOREIGN PATENT DOCUMENTS

CN    201812803 U    4/2011
CN    203894919 U    10/2014
(Continued)

OTHER PUBLICATIONS

Office Action directed to related Chinese Patent Application No. 201910572250.5, dated Oct. 22, 2021; 9 pages.

*Primary Examiner* — Mikhail Kornakov
*Assistant Examiner* — Pradhuman Parihar
(74) *Attorney, Agent, or Firm* — Sterne, Kessler, Goldstein & Fox P.L.L.C.

(57) ABSTRACT

The present disclosure relates to a contamination controlled semiconductor processing system. The contamination controlled semiconductor processing system includes a processing chamber, a contamination detection system, and a contamination removal system. The processing chamber is configured to process a wafer. The contamination detection system is configured to determine whether a contamination level on a surface of the door is greater than a baseline level. The contamination removal system is configured to remove contaminants from the surface of the door in response to the contamination level being greater than the baseline level.

20 Claims, 8 Drawing Sheets

Related U.S. Application Data

(60) Provisional application No. 62/691,914, filed on Jun. 29, 2018.

(56) References Cited

U.S. PATENT DOCUMENTS

| | | | |
|---|---|---|---|
| 2005/0214454 A1* | 9/2005 | Yang | C23C 16/4405 427/248.1 |
| 2005/0258069 A1* | 11/2005 | Halbmaier | H01L 21/67393 206/710 |
| 2006/0228473 A1* | 10/2006 | Satoh | C23C 16/52 134/1.2 |
| 2011/0303362 A1* | 12/2011 | Saito | H01L 21/67069 156/345.33 |
| 2020/0006104 A1 | 1/2020 | Chen et al. | |

FOREIGN PATENT DOCUMENTS

| | | |
|---|---|---|
| CN | 104823271 A | 8/2015 |
| TW | 200410309 A | 6/2004 |
| TW | 201027603 A | 7/2010 |

* cited by examiner

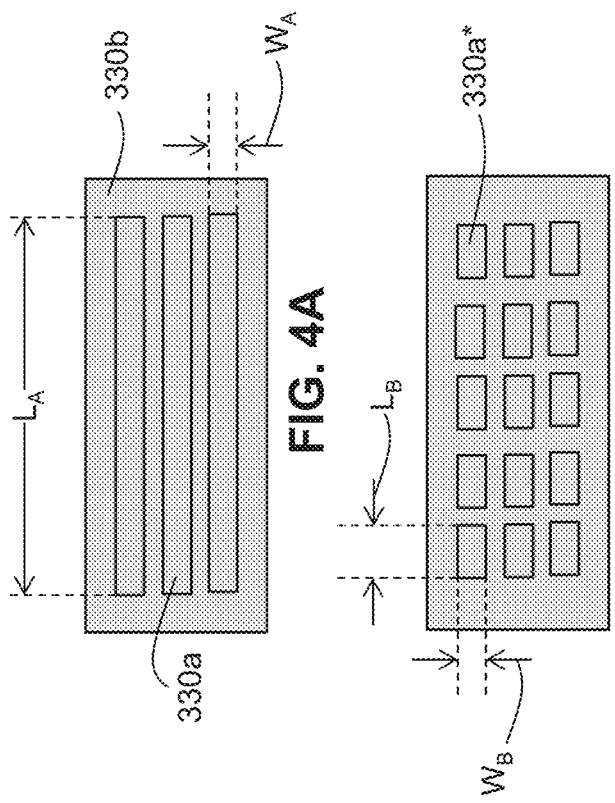
FIG. 4A
FIG. 4B
FIG. 4C
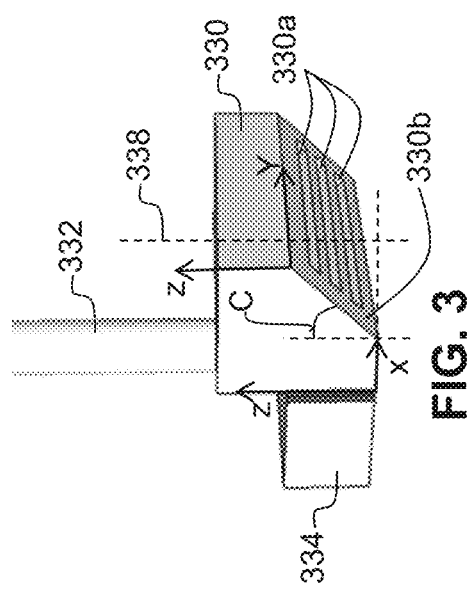
FIG. 3
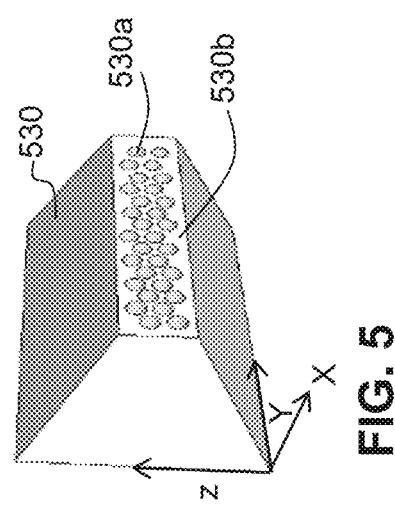
FIG. 5

CONTAMINATION CONTROL IN SEMICONDUCTOR MANUFACTURING SYSTEMS

CROSS-REFERENCE TO RELATED APPLICATIONS

This application is a divisional of U.S. patent application Ser. No. 16/435,751, titled "Contamination Control in Semiconductor Manufacturing Systems," filed Jun. 10, 2019, which claims the benefit of U.S. Provisional Patent Application No. 62/691,914, titled "System and Method for Prevention and Detection of Chemical Residues on Shutter Doors," filed Jun. 29, 2018, each of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices. Such scaling down has increased the complexity of semiconductor manufacturing processes and the demands for contamination control in semiconductor manufacturing systems.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIG. 3 illustrates an isometric view of a contamination removal system, in accordance with some embodiments.

FIGS. 4A-4C illustrate configurations of gas nozzle outlets of a contamination removal system, in accordance with some embodiments.

FIG. 5 illustrates an isometric view of a gas nozzle of a contamination removal system, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figures 1A, 1B:
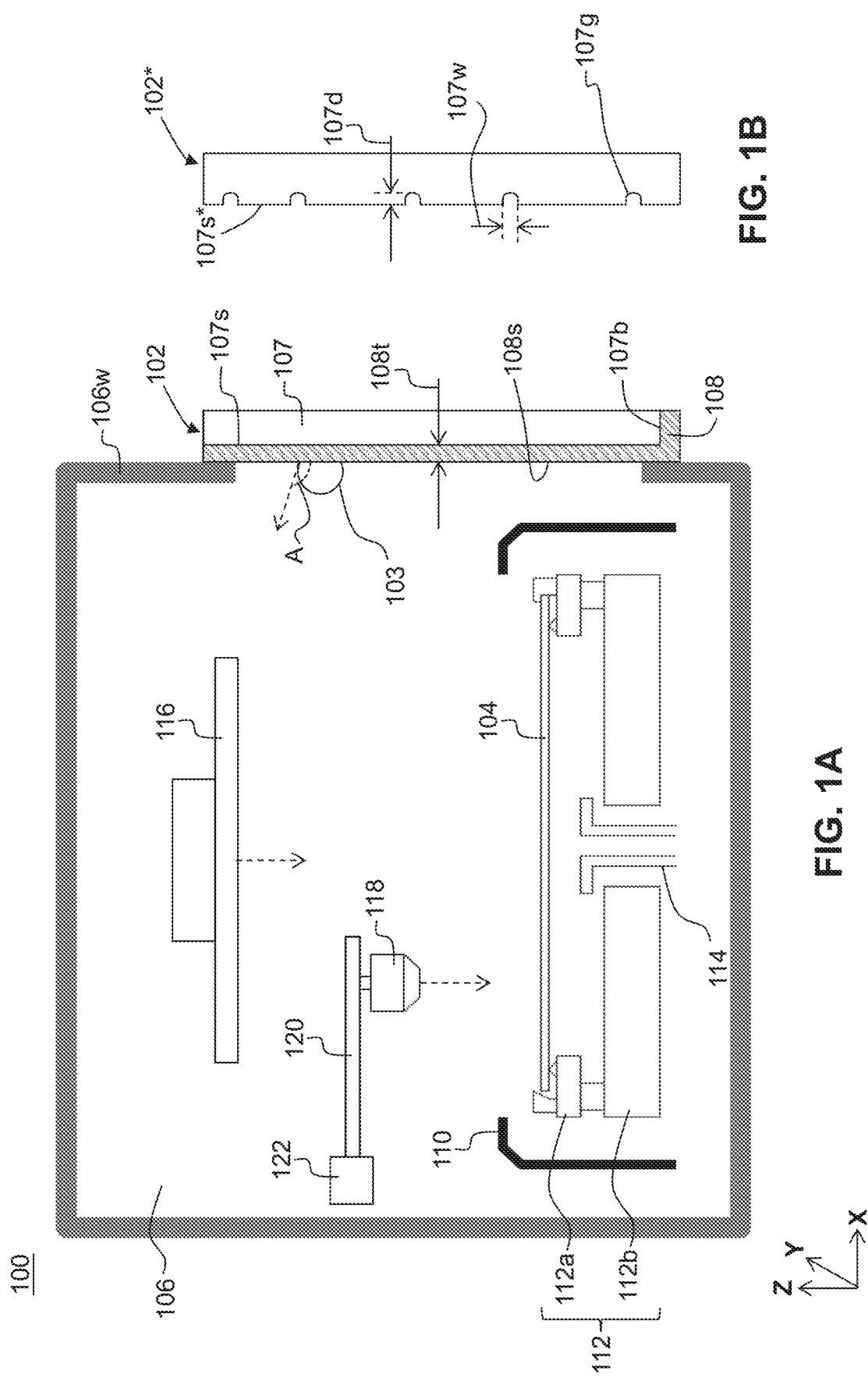
FIG. 1A illustrates a cross-sectional view of a semiconductor processing system with a contamination controlled processing chamber door, in accordance with some embodiments.
FIG. 1B illustrates a cross-sectional view of a contamination controlled processing chamber door, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "about" indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

As used herein, the term "substantially" indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

Semiconductor wafers are subjected to different processes (e.g., etching, cleaning, spin coating, and/or chemical mechanical polishing) in different processing systems during the fabrication of semiconductor devices. These processing systems need to provide contamination-controlled processing chambers during processing of the wafers and also during wafer transfers to and from the processing chambers to prevent or mitigate wafer defects and maintain the integrity of the processed wafers.

In the processing systems, contaminants can be in the form of particulates and/or fluids on the interior surfaces of the processing chambers (e.g., processing chamber walls or processing chamber doors). These contaminants can transfer to the wafers as they are transferred in and out of the processing chambers and form defects on the wafers that can result in defective semiconductor devices, and hence, loss in production yield. The contaminants can be from wet process materials (e.g., etchants, cleaning solutions, photoresist, deionized water, developer solution, and/or slurry) that adhere to the interior surfaces of the processing chambers during wet processing of the wafers. The contaminants can also be in the form of moisture that can collect on the interior surfaces of the processing chambers.

The present disclosure provides example contamination detection and removal systems configured to prevent and/or mitigate wafer contamination during wafer transfers to and from the processing chambers. In some embodiments, the contamination detection systems can be configured to determine the contamination level on the surfaces of the processing chamber doors. Based on the outputs of the contamination detection systems, the contamination removal systems can be configured to remove the contaminants from the side surfaces and/or bottom surfaces of the processing chamber doors. In some embodiments, the contamination detection systems and/or the contamination removal systems can be configured to operate based on the position of the processing chamber doors.

In some embodiments, the contamination removal systems can include contamination removal devices configured to provide gas flow at a high velocity to remove contaminants from the surfaces of the processing chamber doors. The gas flow can be directed at the processing chamber doors at an angle less than 90 degrees with respect to the side surfaces of the processing chamber doors. In some embodiments, contamination removal devices can include wiping elements that can be configured to extract contaminants from the bottom surfaces of the processing chamber doors. The contamination detection and removal systems disclosed herein can increase the production yield of semiconductor devices due to a decrease in defective wafers. In some embodiments, the production yield is improved by about 10% to about 50% compared to processing systems without the contamination detection and removal systems.

FIG. 1 illustrates a cross-sectional view of a semiconductor processing system 100 with a contamination controlled processing chamber door 102, according to some embodiments. Processing system 100 can be configured to process (e.g., etch, clean, spin coat, and/or chemical mechanical polish) a wafer 104 that can include silicon and/or other semiconductor materials. Processing system 100 can include a processing chamber 106 with contamination controlled processing chamber door 102 coupled to a processing chamber wall 106w. Processing chamber door 102 can be configured to control access to and from processing chamber 106 and can be configured to move along the Z-axis during its operation. Processing chamber door 102 can include a metal layer 107 and a hydrophobic layer 108 coating side surface 107s and bottom surface 107b of metal layer 107 to prevent and/or mitigate adhesion of contaminants in the form of moisture and/or wet process materials (e.g., etchants, cleaning solutions, photoresist, deionized water, and/or slurry) that can splash on surface 107s of uncoated processing chamber door 102 during wet processing of wafer 104.

In some embodiments, hydrophobic layer 108 can have a thickness 108t ranging from about 10 nm to about 10 mm (e.g., from about 10 nm to about 50 nm, from about 100 nm to about 1 μm, from about 10 μm to about 100 μm, or from about 1 mm to about 10 mm) and can include a fluorocarbon-based compound, a silane-based compound with a hydrophobic functional group, or a combination thereof. In some embodiments, the hydrophobic functional group can include fluorine, chlorine, ammonia ($NH_3$), trifluoromethane ($CF_3$), or a methyl group ($CH_3$). In some embodiments, the hydrophobic functional group can include dodecyltriethoxysilane, trichlorododecylsilane, 3,3,3-trifluoropropyl trichlorosilane, or 3,3,3-trifluoropropyl trimethoxysilane. In some embodiments, surface 108s of hydrophobic layer 108 can have a water contact angle ranging from about 93 degrees to about 176 degrees. The water contact angle is a measure of hydrophobicity of solid surfaces. Solid surfaces with water contact angles greater than 90 degrees can be defined as hydrophobic and the water contact angle can be defined as an angle at which a liquid interface meets a solid surface. For example, in FIG. 1A, a water contact angle A is formed between a droplet 103 of contaminant and surface 108s. Due to the hydrophobicity of surface 108s, water contact angle A can be within the range from about 93 degrees to about 176 degrees, and as a result prevent adhesion of droplet 103 to surface 108s.

In some embodiments, the formation of hydrophobic layer 108 can include a deposition process followed by an annealing process. The deposition process can include selectively coating (e.g., spin coating, spray coating, or other suitable coating methods) surfaces 107s and 107b with a fluorocarbon-based polymer solution or a silane solution having the hydrophobic functional group. The annealing process can include thermally treating coated surfaces 107s and 107b at a temperate ranging from about 100° C. to about 130° C. for a duration ranging from about 1 hour to about 2 hours.

In some embodiments, instead of or in addition to layer 108, surfaces 107s and 107b can be textured to form a surface similar to surface 107s* (illustrated in FIG. 1B) that can provide a hydrophobic surface with a water contact angle ranging from about 93 degrees to about 176 degrees. FIG. 1B shows a processing chamber door 107* with a textured surface 107s*. The discussion of processing chamber door 102 applies to processing chamber door 102*, unless mentioned otherwise.

Textured surface 107s* can have a plurality of cavities 107g. In some embodiments, each cavity 107g can have a depth 107d ranging from about 16 nm to about 10 μm and can have a width 107w ranging from about 3 nm to about 2 μm. In some embodiments, each cavity can have an aspect ratio (ratio of depth 107d to width 107w) equal to or greater than about 5 (e.g., about 5.5, about 6, about 6.5, about 7, about 8, or about 10) or in a range from about 5 to about 12. The number, the arrangement, and the dimensions of cavities 107g can be selected based on the desired water contact angle for surface 107s*.

In some embodiments, the formation of textured surface 107s* can include performing a laser treatment on an untextured surface of processing chamber door 102* at a temperature ranging from about 100° C. to about 200° C. for a duration ranging from about 10 seconds to about 30 second. The laser treatment can include irradiating the untextured surface with a femtosecond fiber laser having a wavelength ranging from about 800 nm to about 1000 nm, a pulse energy ranging from about 1.5 µJ to about 2 µJ, and a pulse repetition rate ranging from about 1 MHz to about 2 MHz.

Referring back to FIG. 1A, in some embodiments, processing system 100 can further include a catch cup 110, a wafer stage 112, a backside nozzle 114, a shield plate 116, and a spray nozzle 118 coupled to a nozzle arm 120 and a driving element 122. Processing system 100 can include additional components (not shown) required for operation, such as transfer modules, wet cleaning stations, robotic arms, pumps, exhaust lines, heating elements, gas and chemical delivery lines, controllers, valves, and external and internal electrical connections to other components of a cluster tool (e.g., computer units, chemical analyzers, mass flow controllers, pressure controllers, valves, and pumps). These additional components are within the spirit and scope of this disclosure.

Catch cup 110 can be configured to provide an environment for wet processing wafer 104. The upper portion of catch cup 110 can tilt inward to facilitate retaining waste products within it that can be collected during the wet processing of wafer 104 and to facilitate draining the waste products through an exhaust system coupled to the bottom portion of catch cup 110.

Wafer stage 112—includes a wafer holder 112a and a spin base 112b—and can be positioned within catch cup 110. Wafer holder 112a can be coupled to spin base 112b and can be configured to hold and spin wafer 104 via spin base 112b during a wet or dry processing of wafer 104 at different speeds. In some embodiments, wafer holder 112a can be configured to securely hold wafer 104 by a clamping mechanism, such as vacuum clamping or electrostatic chuck clamping. In some embodiments, wafer holder 112a can be further configured to tilt or dynamically change the tilt angle. In some embodiments, wafer stage 112 can be fitted with a suitable heating mechanism to heat wafer 104 to a desired temperature.

Shield plate 116 can be positioned above wafer stage 112 and configured to spray cleaning solution to clean residual products from top surface of wafer 104 after a wet processing step has been performed on wafer 104. Cleaning solution can include, for example, water, deionized water, a solution of ammonium hydroxide, hydrogen peroxide, and water, a solution of hydrochloric acid, hydrogen peroxide, and water, or a combination thereof. Additionally or alternatively, shield plate 116 can be configured to discharge gas on a top surface of wafer 104 to dry wafer 104 after a cleaning step has been performed on wafer 104.

In some embodiments, shield plate 116 can be configured to move along the Z-axis and the distance between shield plate 116 and wafer 104 can be adjusted based on the operation mode of shield plate. For example, shield plate 116 can be lowered close to wafer 104 during its wafer cleaning and/or a wafer drying mode of operation and can be raised back to its home position after completion of the wafer cleaning and/or drying steps. In some embodiments, backside of wafer 104 can be cleaned and/or dried after a wet processing step using backside nozzle 114 that can extend through spin base 112b. Backside nozzle 114 can be configured to supply cleaning solution to clean and/or discharge drying gas to dry backside of wafer 104.

Spray nozzle 118 coupled to nozzle arm 120 and driving element 122 can be configured to scan across the top surface of wafer 104 along X-axis and/or Y-axis and dispense one or more chemical solutions (e.g., etchants, cleaning solutions, photoresist, developer solution, and/or slurry) in the form of a spray to the top surface of wafer 104 for wet processing. In some embodiments, spray nozzle 118 can pivot around driving element 122 while the one or more chemical solutions are dispensed on wafer 104. At the same time, wafer 104 can be rotated while the one or more chemical solutions are dispensed on its surface. In some embodiments, the distance between spray nozzle 118 and wafer 104 can be adjusted or remain fixed for the duration of the wet process. In some embodiments, nozzle arm 120 can be extended to position spray nozzle 118 over a central portion of wafer 104 for dispensing the one or more chemical solutions and can be retracted to move spray nozzle 118 away from wafer 104 after completion of the dispensing operation. The movement of nozzle arm 120 can be controlled by driving element 122 (e.g., a motor or an actuator) that can be controlled by a control system (not shown).

Spray nozzle 118 can be connected via one or more chemical switch boxes to external tanks filled with chemical solutions. The chemical switch boxes can be chemical distribution systems, where valves, flow meters, sensors, chemical distribution lines, and the like are housed and chemical solutions are pre-mixed prior to delivery to spray nozzle 118. The one or more chemical switch boxes can be configured to control the connection and delivery rate of the one or more chemical solutions onto wafer 104. The chemical switch boxes and the external tanks are not shown in FIG. 1 for simplicity.

Figure 2:
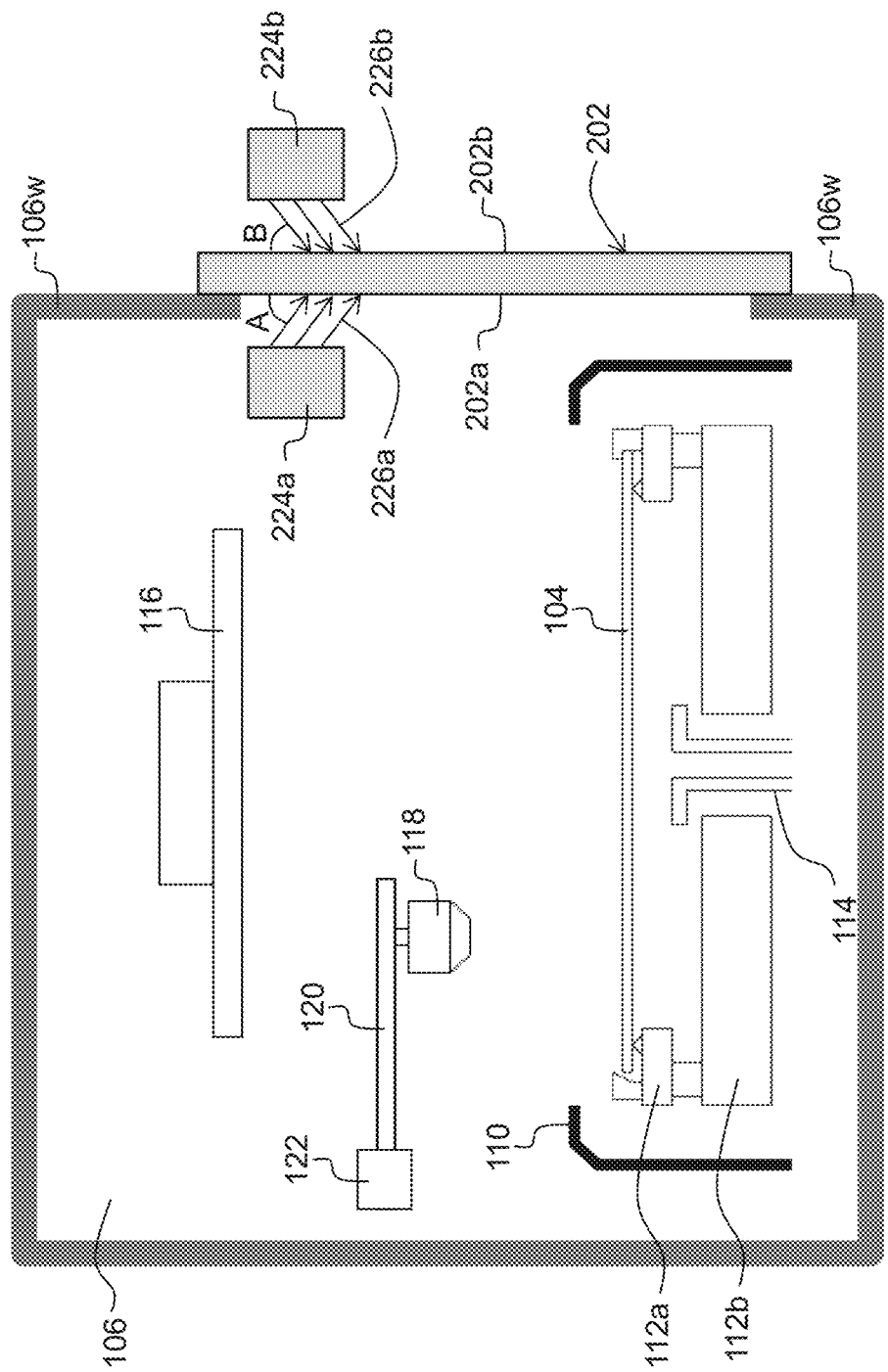
FIG. 2 illustrates a cross-sectional view of a semiconductor processing system with a contamination removal system, in accordance with some embodiments.

FIG. 2 illustrates a cross-sectional view of a semiconductor processing system 200 with a contamination removal systems 224a-224b, according to some embodiments. The above discussion of processing system 100 applies to processing system 200 unless mentioned otherwise. Contamination removal system 224a can be configured to remove contaminants in the form of moisture and/or wet process materials (e.g., etchants, cleaning solutions, photoresist, deionized water, developer solution, and/or slurry) that can adhere to surface 202a of processing chamber door 202 during wet processing of wafer 104. Contaminants in the form of moisture and/or unwanted particulates on surface 202b of processing chamber door 202 can be removed with contamination removal system 224b. In some embodiments, semiconductor processing system 200 can have contamination removal systems 224a without contamination removal system 224b. In some embodiments, processing chamber door 202 may or may not have a hydrophobic coating layer (not shown) and/or a textured surface (not shown) similar to coating layer 108 and textured surface 107s* of processing chamber doors 102 and 102*, respectively, on its surface 202a.

Contamination removal systems 224a-224b can be configured to discharge streams of gas 226a-226b towards surfaces 202a-202b, respectively, at a high velocity and to direct these streams of gas 226a-226b to strike surfaces 202a-202b at incident angles A-B, respectively, such that contaminants can be blown off surfaces 202a-202b. In some embodiments, the high velocity can range from about 5 cm/sec to about 20 cm/sec and incident angles A-B can range from about 15 degrees to about 75 degrees.

In some embodiments, contamination removal systems 224a-224b can be controlled to operate during a wet process, after completion of the wet process on wafer 104, and/or before opening of processing chamber door 202. Processing chamber door 202 is shown in a closed position in FIG. 2. Each of contamination removal systems 224a-224b can be controlled and operated independently of each other, according to some embodiments. Contamination removal systems 224a-224b can be configured to discharge streams of gas 226-226b at fixed regions on surfaces 202a-202b, respectively, and/or move streams of gas 226a-226b on respective surfaces 202a-202b along Z-axis and/or Y-axis.

Streams of gas 226a-226b can be supplied to contamination systems 224a-224b via gas lines coupled to one or more external tanks that contain gases in high purity (above 99.999%) and under pressure suitable for removing contaminants. These external tanks can be part of a gas distribution system, where a network of gas valves and gas distribution lines are housed. The external tanks and their connections are not shown for simplicity. Streams of gas 226a-226b can include, for example, clean dry air, inert gases such as nitrogen, helium, argon, or a combination thereof.

In some embodiments, the gas or gas mixture for streams of gas 226a-226b can be selected based on the type of contaminants detected on surfaces 202a-202b. These streams of gas 226a-226b can function as a carrier gas that can transport the contaminants away from surfaces 202-202b, but does not chemically react with the contaminants. The contaminants can include volatile organic compounds, derivatives of ammonia (e.g., amines), acids (such as hydrofluoric acid, hydrochloric acid. etc.), acetone, sulfur dioxide, isopropyl alcohol, water vapors, other types of chemicals, or combinations thereof that may be used in one or more wet processes on wafer 104. The gas or gas mixture can be selected such that it does not chemically react with the contaminants and result in the formation of deposits on surfaces 202a-202b and/or in the formation of gaseous products or byproducts that can react with materials on wafer 104 and form defects on wafer 104. In some embodiments, the gas or gas mixture can be selected to reduce the oxygen content in processing chamber 106, as oxygen can react with acidic solutions used during the wet processing of wafer 104 and form defects on wafer 104.

In some embodiments, each of contamination removal systems 224a-224b can include a gas nozzle 330, a gas line 332, and a nozzle actuator 334 as illustrated in FIG. 3. Even though each contamination removal systems 224a-224b is shown to have one gas nozzle 330, each contamination removal systems 224a-224b can have one or more gas nozzles. Gas nozzle 330 can be positioned at a lateral distance, along X-axis, of about 1 cm to about 5 cm (e.g., from about 1 cm to about 2 cm, from about 2 cm to about 3 cm, from about 3 cm to about 4 cm, or from about 4 cm to about 5 cm) away from a surface (e.g., surfaces 202a-202b) to be decontaminated. Gas nozzle 330 can be configured to discharge a stream of gas similar to streams of gas 226a-226b on surfaces 202-202b, as discussed above with reference to FIG. 2, through a plurality of gas nozzle outlets 330a. Gas nozzle 330 used in contamination removal systems 224a and/or 224b can be controlled to operate continuously or periodically during the wet processing of wafer 104 and/or after completion of the wet process while processing chamber door 202 is in a closed position.

Gas nozzle outlets 330a can be arranged in any configuration or have any type of geometric shape, such as but not limited to rectangular, spherical, or elliptical shapes. For example, FIGS. 4A-4C illustrates different shapes and configurations of gas nozzle outlets that can be formed on a nozzle outlet surface 330b of gas nozzle 330, according to some embodiments. FIG. 4A shows a one-dimensional array of rectangular shaped gas nozzle outlets 330a. Each of gas nozzle outlets 330a can have a length $L_A$ ranging from about 20 cm to about 40 cm (e.g., from about 20 cm to about 25 cm, from about 25 cm to about 30 cm, from about 30 cm to about 35 cm, or from about 35 cm to about 40 cm) and have a width WA ranging from about 0.5 cm to about 3 cm (e.g., from about 0.5 cm to about 1 cm, from about 1 cm to about 1.5 cm, from about 1.5 cm to about 2 cm, from about 2 cm to about 2.5 cm, or from about 2.5 cm to about 3 cm). FIG. 4B shows a two-dimensional array of rectangular shaped gas nozzle outlets 330a*. Each of gas nozzle outlets 330a* can have a length $L_B$ ranging from about 2 cm to about 6 cm (e.g., from about 2 cm to about 3 cm, from about 3 cm to about 4 cm, from about 4 cm to about 5 cm, or from about 5 cm to about 6 cm) and have a width WB ranging from about 0.5 cm to about 3 cm (e.g., from about 0.5 cm to about 1 cm, from about 1 cm to about 1.5 cm, from about 1.5 cm to about 2 cm, from about 2 cm to about 2.5 cm, or from about 2.5 cm to about 3 cm). FIG. 4C shows a two-dimensional array of circular shaped gas nozzle outlets 330a. Each of gas nozzle outlets 330a can have a diameter Dc ranging from about 0.5 cm to about 3 cm (e.g., from about 0.5 cm to about 1 cm, from about 1 cm to about 1.5 cm, from about 1.5 cm to about 2 cm, from about 2 cm to about 2.5 cm, or from about 2.5 cm to about 3 cm).

Referring back to FIG. 3, nozzle outlet surface 330b of gas nozzle 330 can be sloped at an angle C with respect to the Z-axis or YZ-plane when gas nozzle 330's vertical axis of symmetry 338 is substantially parallel to the Z-axis. The sloped nozzle outlet surface 330b can help to direct streams of gas 226a-226b such that they strike surfaces 202a-202b at incident angles A-B, as discussed above with reference to FIG. 2. In some embodiments, angle C can range from about 30 degrees to about 60 degrees. In some embodiments, the direction of streams of gas 226-226b and as a result, incident angles A-B can be dynamically adjusted by rotating gas nozzle 330 and its vertical axis of symmetry 338 about the X-axis. When gas nozzle 330 is in a state of rotation along the X-axis, the angle between the sloped surface 330b and the Z-axis can be smaller or greater than angle C, which is the angle between the sloped surface 330b and the Z-axis when gas nozzle 330 is not rotated along the X-axis. In some embodiments, the rotation of gas nozzle 330 about the X-axis can be performed by nozzle actuator 334 coupled to gas nozzle 330. In some embodiments, gas nozzle 330 can be rotated about the Z-axis and moved along the Z-axis and/or Y-axis using a motor (not shown) coupled to gas nozzle 330. Moving gas nozzle 330 along the Z-axis and/or Y-axis while ejecting streams of gas (e.g., streams of gas 226a-226b) can help to increase the force to remove contaminants from surfaces (e.g., surfaces 202a-202b) more effectively compared to keeping gas nozzle 330 fixed at one position during the surface decontamination operation.

The stream of gas discharged from gas nozzle outlets 330a can be delivered to gas nozzle 330 via gas line 332 that can be coupled to the one or more external tanks that contain gases in high purity (above 99.999%) and under pressure suitable for removing contaminants. Gas line 332 can also be coupled to a control system (not shown) that can control the type of gas delivered, the gas pressure, the delivery rate, the gas temperature, and/or the duration of delivery. In some embodiments, the control system can have devices, such as valves, sensors, flow meters, and the like.

In some embodiments, each of contamination removal systems 224a-224b can have a gas nozzle shaped as gas nozzle 530 of FIG. 5 instead of gas nozzle 330. The discussion of gas nozzle 330 applies to gas nozzle 530 unless mentioned otherwise. Even though gas nozzle 530 is shown to have circular gas nozzle outlets 530a, gas nozzle 530 can have nozzle outlets shaped and arranged as illustrated in FIGS. 4A-4C, according to some embodiments. Similar to gas nozzle 330, gas nozzle 530 can be configured to discharge a stream of gas similar to streams of gas 226a-226b on surfaces 202a-202b through gas nozzle outlets 530a. Unlike gas nozzle 330, gas nozzle 530 can have a nozzle outlet surface 530b substantially parallel to the YZ-plane when gas nozzle 530 is not in a rotated state. When gas nozzle 530 is rotated using a nozzle actuator (e.g., nozzle actuator 334), nozzle outlet surface 530b can be sloped at an angle ranging from about 15 degrees to about 75 degrees with respect to the YZ-plane.

Figure 6:
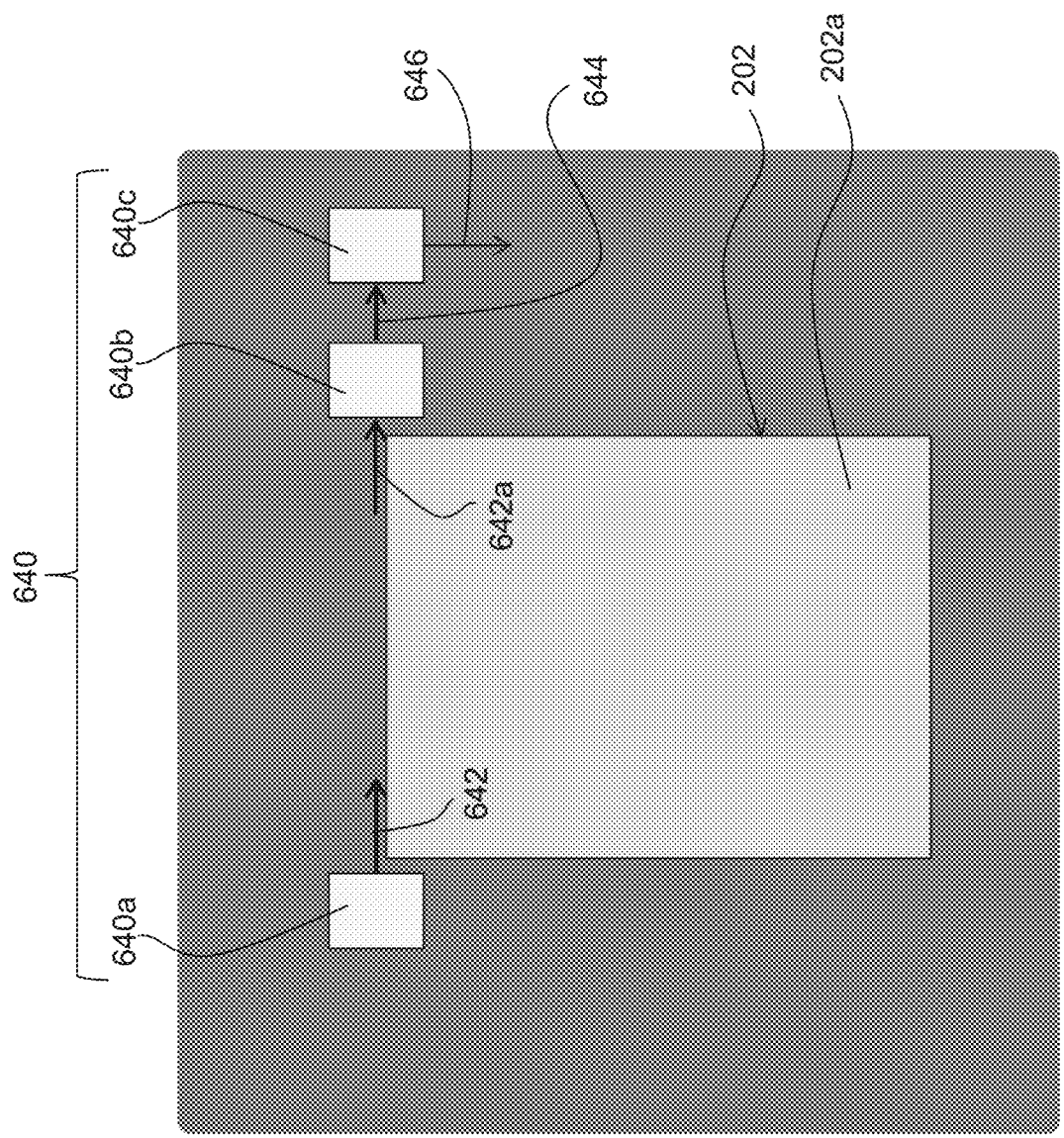
FIG. 6 illustrates a cross-sectional view of a contamination detection system in a semiconductor processing system, in accordance with some embodiments.
Figure 6:
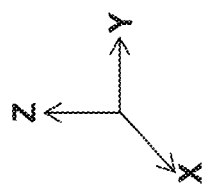

FIG. 6 illustrates a cross-sectional view of a contamination detection system 640 that can be part of semiconductor processing system 200 of FIG. 2, according to some embodiments. Contamination detection system 640 can be positioned within processing chamber 106 and configured to determine the contamination level on interior surface 202a of processing chamber door 202. Even though contamination detection system 640 is shown to be positioned within processing chamber 106, a contamination detection system can be used positioned outside processing chamber 106 to determine a contamination level on exterior surface 202b of processing chamber door 202. Contamination detection system 640 can be controlled by a control system (not shown) to run after the completion of a wet process on wafer 104 and/or prior to opening processing chamber door 202. Processing chamber door 202 is shown in a closed position in FIG. 6. Based on the output of contamination detection system 640, the operation of contamination removal system 224a can be controlled by the same control system or another control system (not shown). For example, contamination removal system 224a can be activated to run prior to opening processing chamber door 202 if contamination detection system 640 outputs a contamination level above a baseline level. Otherwise, processing chamber door 202 can be opened without running contamination removal system 224a when contamination detection system 640 outputs a contamination level below the baseline level.

The term "baseline level," as used herein, refers to a contamination level that has been deemed to have minimal impact on subsequent processing operations or have any appreciable impact on wafer yield loss. The baseline level can be determined by a correlation study between historical contamination data and the contamination's impact on wafer yield and/or between historical contamination data and the contamination's impact on subsequent operations or processes. In some embodiments, the baseline level can be one or more stored values in a database, a server, or on a local storage medium in processor 640c.

Contamination detection system 640 can include an infrared (IR) emitter 640a, an IR detector 640b, and a processor 640c that each can be controlled by the control system to operate after the completion of a wet process on wafer 104 and/or prior to opening processing chamber door 202. IR emitter 640a and IR detector 640b can be coupled to processing chamber wall 106w's interior side that faces processing chamber 106. Both IR emitter 640a and IR detector 640b can be configured to move substantially simultaneously along the Z-axis during the detection operation of contamination detection system 640. For example, motors and rails (not shown) on the interior side of chamber wall 106w can be used to move both IR emitter 640a and IR detector 640b along the Z-axis during their operation. While moving along the Z-axis continuously or in discrete steps, IR emitter 640a can be configured to emit IR light 642 along the Y-axis and IR detector 640b can be configured to receive a portion 642a of IR light 642 and detect the intensity of the received portion 642a. As such, IR light 642 can scan surface 202a for contaminants along both the Y- and Z-axes.

The detected intensity can be an indicator of the contamination level on surface 202a. For example, in the presence of contaminants on surface 202a, the intensity of received portion 642a can be less than the intensity of emitted IR light 642 due to scattering or diffraction of emitted IR light 642 by the contaminants. Otherwise, the intensity of received portion 642a can be substantially equal to the intensity of emitted IR light 642. In some embodiments, IR emitter 640a can be positioned such that during its operation the path of IR light 642 is at a lateral distance, along X-axis, of about 1 µm to about 1 cm (e.g., from about 1 µm to about 100 µm, from about 100 µm to about 500 µm, from about 500 µm cm to about 1 mm, or from about 1 mm to about 1 cm) away from surface 202a.

Referring back to FIG. 6, processor 640c can be configured to receive a signal 644 with the intensity data detected by IR detector 640b from portion 642a and determine the contamination level on surface 202a based on the intensity data. Processor 640c can be further configured to compare the determined contamination level to the baseline level and output a signal 646 indicating whether the contamination level is elevated, equal to, or below the baseline level. Based on signal 646, the operation of contamination removal system 224a (FIG. 2) can be controlled. For example, if signal 646 indicates an elevated contamination level, contamination removal system 224a can be activated to run a decontamination process on surface 202a before opening processing chamber door 202 as discussed with reference to FIGS. 2-3. Otherwise, processing chamber door 202 can be opened without running a decontamination process on surface 202a when signal 646 indicates that the contamination level is equal to or below the baseline level.

Figure 7:
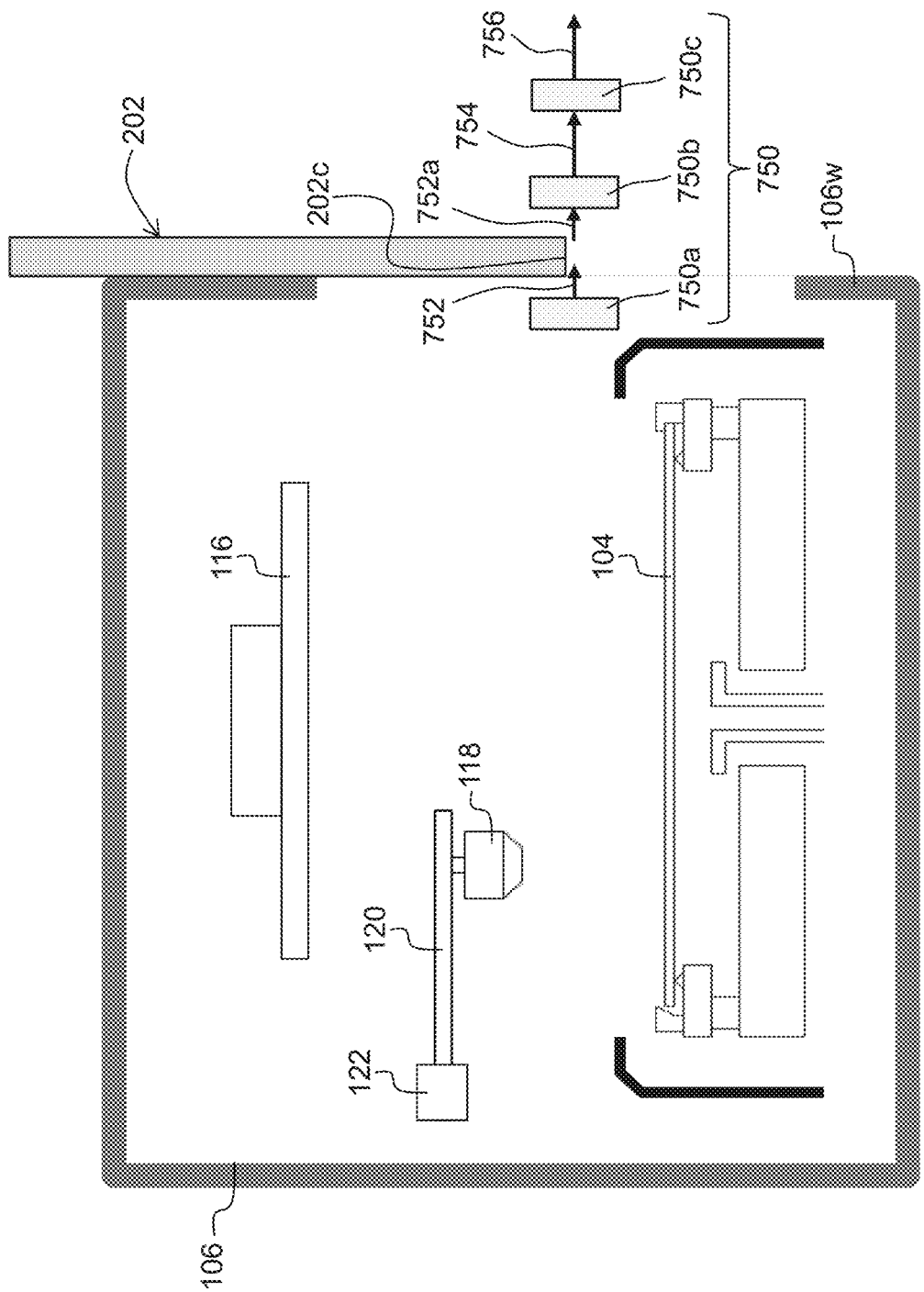
FIG. 7 illustrates a cross-sectional view of a contamination detection system, in accordance with some embodiments.

FIG. 7 illustrates a cross-sectional view of a contamination detection system 750 that can be part of semiconductor processing system 200 of FIG. 2, according to some embodiments. In some embodiments, semiconductor processing system 200 can have both contamination detection system 640, contamination detection system 750, or both. Contamination detection system 750 can be configured to detect a contamination level on bottom surface 202c of processing chamber door 202. Contamination detection system 750 can be controlled by a control system (not shown) to run after opening processing chamber door 202 and before transferring wafer 104 into or out of processing chamber 106. Processing chamber door 202 is shown in an open position in FIG. 7. Even though processing chamber door 202 is shown to open vertically upwards along Z-axis, processing chamber door 202 can be opened in other directions, such as vertically downwards or horizontally about a vertical hinge on chamber wall 106w (not shown).

Contamination detection system 750 can include an infrared (IR) emitter 750a, an IR detector 750b, and a processor 750c that each can be controlled by the control system to operate after opening processing chamber door and before transferring wafer 104 into or out of processing chamber 106. Both IR emitter 750a and IR detector 750b can be configured to move substantially simultaneously along the Y-axis during the detection operation of contamination detection system 750. For example, robotic arms and/or actuators (not shown) can be used to move both IR emitter 750a and IR detector 750b along the Y-axis during their operation. While moving along the Y-axis continuously or in discrete steps, IR emitter 750a can be configured to emit IR light 752 along the X-axis, and IR detector 750b can be configured to receive a portion 752a of IR light 752 and detect the intensity of the received portion 752a. As such, IR light 752 can scan surface 202c for contaminants along both the X- and Y-axes. In some embodiments, IR emitter 750a and IR detector 750b can be positioned near the bottom portion and opposite sides of processing chamber door 202 such that during operation the path of IR light 752 is at a lateral distance, along Z-axis, of about 1 µm to about 1 cm (e.g., from about 1 µm to about 100 µm, from about 100 µm to about 500 µm, from about 500 µm cm to about 1 mm, or from about 1 mm to about 1 cm) away from bottom surface 202c.

The operation of contamination detection system 750 can be similar to contamination detection system 640 discussed above with reference to FIG. 6. The intensity detected by IR detector 750b can be an indicator of the contamination level on surface 202c. Similar to processor 640c, processor 750c can be configured to receive a signal 754 with the intensity data detected by IR detector 750b from portion 752a and determine the contamination level on surface 202c based on the intensity data. Processor 750c can be further configured to compare the determined contamination level to the baseline level and output a signal 756 indicating whether the contamination level is elevated, equal to, or below the baseline level. Based on signal 756, the operation of a contamination removal system such as contamination removal system 860 described below with reference to FIG. 8 can be controlled. For example, if signal 756 indicates an elevated contamination level, the contamination removal system can be activated to run a decontamination process on surface 202c before transferring wafer 104 into or out of processing chamber 106 as discussed below in further detail with reference to FIG. 8. Otherwise, wafer 104 can be transferred into or out of processing chamber 106 without running a decontamination process on surface 202c when signal 756 indicates that the contamination level is equal to or below the baseline level.

Figure 8:
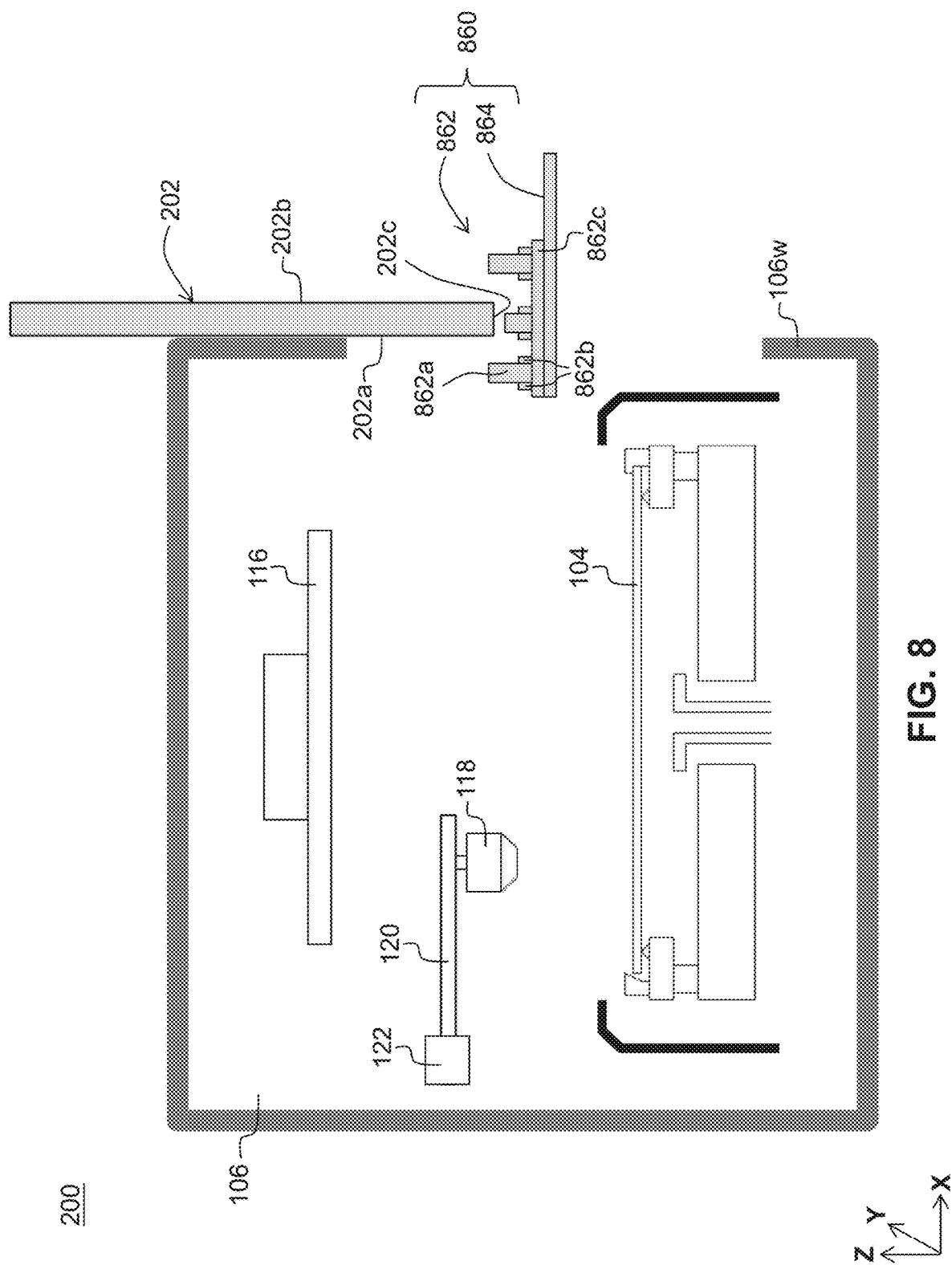
FIG. 8 illustrates a cross-sectional view of a semiconductor processing system with a contamination removal system, in accordance with some embodiments.

FIG. 8 illustrates a cross-sectional view of a semiconductor processing system 200 with a contamination removal system 860, according to some embodiments. Contamination removal system 860 can be configured to remove contaminants in the form of moisture and/or wet process materials (e.g., etchants, cleaning solutions, photoresist, deionized water, developer solution, and/or slurry) that can slide down from surfaces 202a and/or 202b and collect on surface 202c. In some embodiments, contamination removal system 860 can be controlled to run when processing chamber door 202 is in an open position for transferring wafer 104 into or out of processing chamber 106. Processing chamber door 202 is shown in an open position in FIG. 8. In some embodiments, contamination removal system 860 can be controlled to run based on signal 756 of contamination detection system 750 (FIG. 7). For example, if signal 756 indicates an elevated contamination level, contamination removal system 860 can be activated to run a decontamination process on surface 202c. Otherwise, wafer 104 can be transferred into or out of processing chamber 106 without running a decontamination process on surface 202c when signal 756 indicates that the contamination level is equal to or below the baseline level.

Figure 9A:
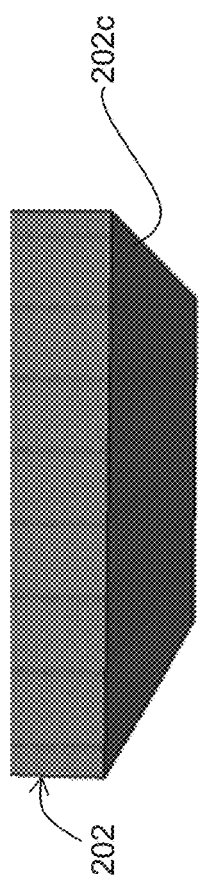
FIGS. 9A-9C illustrate perspective views of a contamination removal device, in accordance with some embodiments.
Figure 9A:
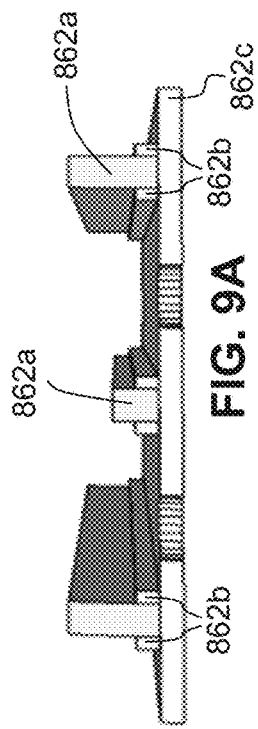
Figure 9C:
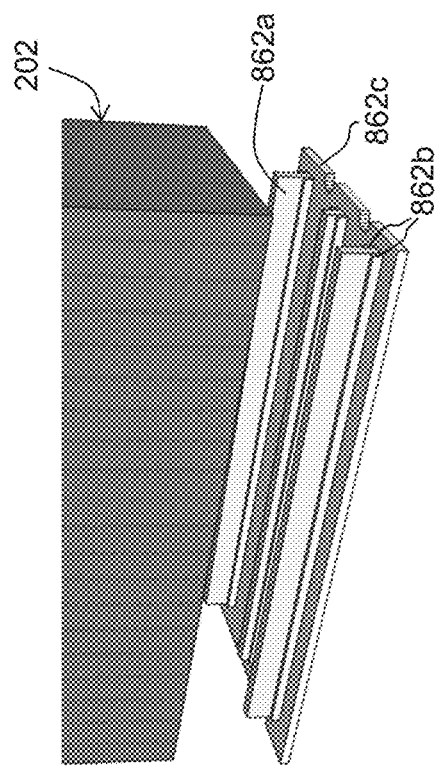
Figure 9B:
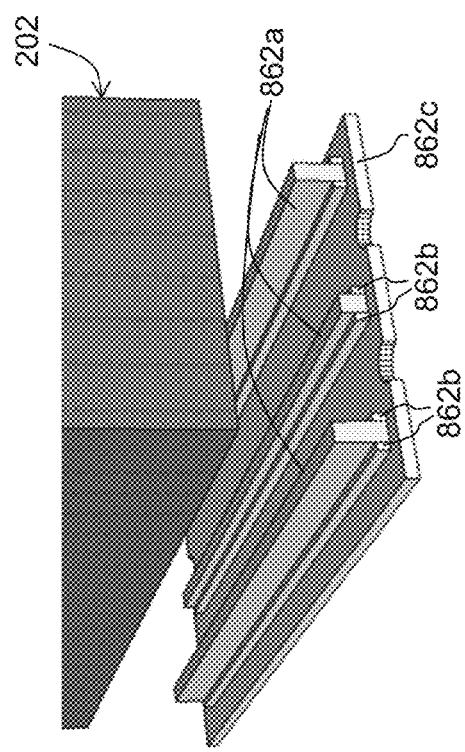

Contamination removal system 860 can include a contamination removal device 862 configured to remove contaminants from surfaces 202a, 202b, and/or 202c by wiping contaminants off these surfaces. Different perspective views of contamination removal device 862 are illustrated in FIGS. 9A-9C. Contamination removal device 862 can include an array of wiping elements 862a, pairs of supporting elements 862b, and a substrate 862c to hold wiping elements 862a and pairs of supporting elements 862b. Even though three wiping elements 862a are shown in FIG. 8, contamination removal device can have two or more wiping elements. Each of wiping elements 862a can be supported by a pair of supporting elements 862b to prevent the supported portion of wiping element 862a from bending with its upper unsupported portion during a wiping operation of contamination removal device 862. Preventing the lower portions of wiping elements 862a from bending can help to reduce stress and wear at the interfaces between wiping elements 862a and substrate 862c during the wiping operation, and as a result, improve the lifetime of contamination removal device 862.

Wiping elements 862a can be configured to wipe off contaminants from surfaces 202a, 202b, and/or 202c during the wiping operation. In some embodiments, each of wiping elements 862a can have the same dimensions. In some embodiments, adjacent wiping elements in the array of wiping elements 862a can have different dimensions from each other. For example, adjacent wiping elements in the array of wiping elements 862a can have vertical dimensions along Z-axis (e.g., height) different from each other and can have horizontal dimensions along Y-axis (e.g., length) equal to each other, as shown in FIGS. 8 and 9A-9C. In some embodiments, one wiping element in the array of wiping elements 862a can be about 0.5 cm to about 2 cm (e.g., from about 0.5 cm to about 1 cm, from about 1 cm to about 1.5 cm, or from about 1.5 cm to about 2 cm) shorter in height than another adjacent wiping element in the array of wiping elements 862a. In some embodiments, each of wiping elements 862a can have a height ranging from about 1 cm to about 5 cm (e.g., from about 1 cm to about 2 cm, from about 2 cm to about 3 cm, from about 3 cm to about 4 cm, or from about 4 cm to about 5 cm), a width ranging from about 0.5 cm to about 1 cm (e.g., from about 0.5 cm to about 0.6 cm, from about 0.6 cm to about 0.7 cm, from about 0.7 cm to about 0.8 cm, from about 0.8 cm to about 0.9 cm, or from about 0.9 cm to about 1 cm), and a length ranging from about 10 cm to about 30 cm (e.g., from about 10 cm to about 15 cm, from about 15 cm to about 20 cm, from about 20 cm to about 25 cm, or from about 25 cm to about 30 cm). In some embodiments, each of supporting elements 862b can have a height ranging from about 0.1 cm to about 1 cm (e.g., from about 0.1 cm to about 0.3 cm, from about 0.3 cm to about 0.5 cm, from about 0.5 cm to about 0.7 cm, from about 0.7 cm to about 0.9 cm, or from about 0.9 cm to about 1 cm), a width ranging from about 0.1 cm to about 0.5 cm (e.g., from about 0.1 cm to about 0.2 cm, from about 0.2 cm to about 0.3 cm, from about 0.3 cm to about 0.4 cm, or from about 0.4 cm to about 0.5 cm), and a length ranging from about 10 cm to about 30 cm (e.g., from about 10 cm to about 15 cm, from about 15 cm to about 20 cm, from about 20 cm to about 25 cm, or from about 25 cm to about 30 cm). Wiping elements 862a and supporting elements 862b can have lengths equal to each other. Wiping elements 862a can include natural rubber or synthetic rubber, and supporting elements 862b can include Teflon or polyvinyl chloride (PVC).

Referring back to FIG. 8, contamination removal system 860 can further include a moving mechanism 864 (e.g., actuator, robotic arm, etc.) configured to move contamination removal device 862 along the X-axis during the wiping operation. Moving mechanism 864 can position contamination removal device 862 close to bottom surface 202c such that the shorter ones among wiping elements 862a can come in contact with surface 202c and the taller ones among wiping elements 862a can come in contact with surfaces 202a and 202b during the wiping operation. As such, having wiping elements 862a of different heights can help to remove contaminants from bottom surface 202c and also from bottom edges of processing chamber door 202 formed between surfaces 202a and 202c and between surfaces 202b and 202c.

Figure 10:
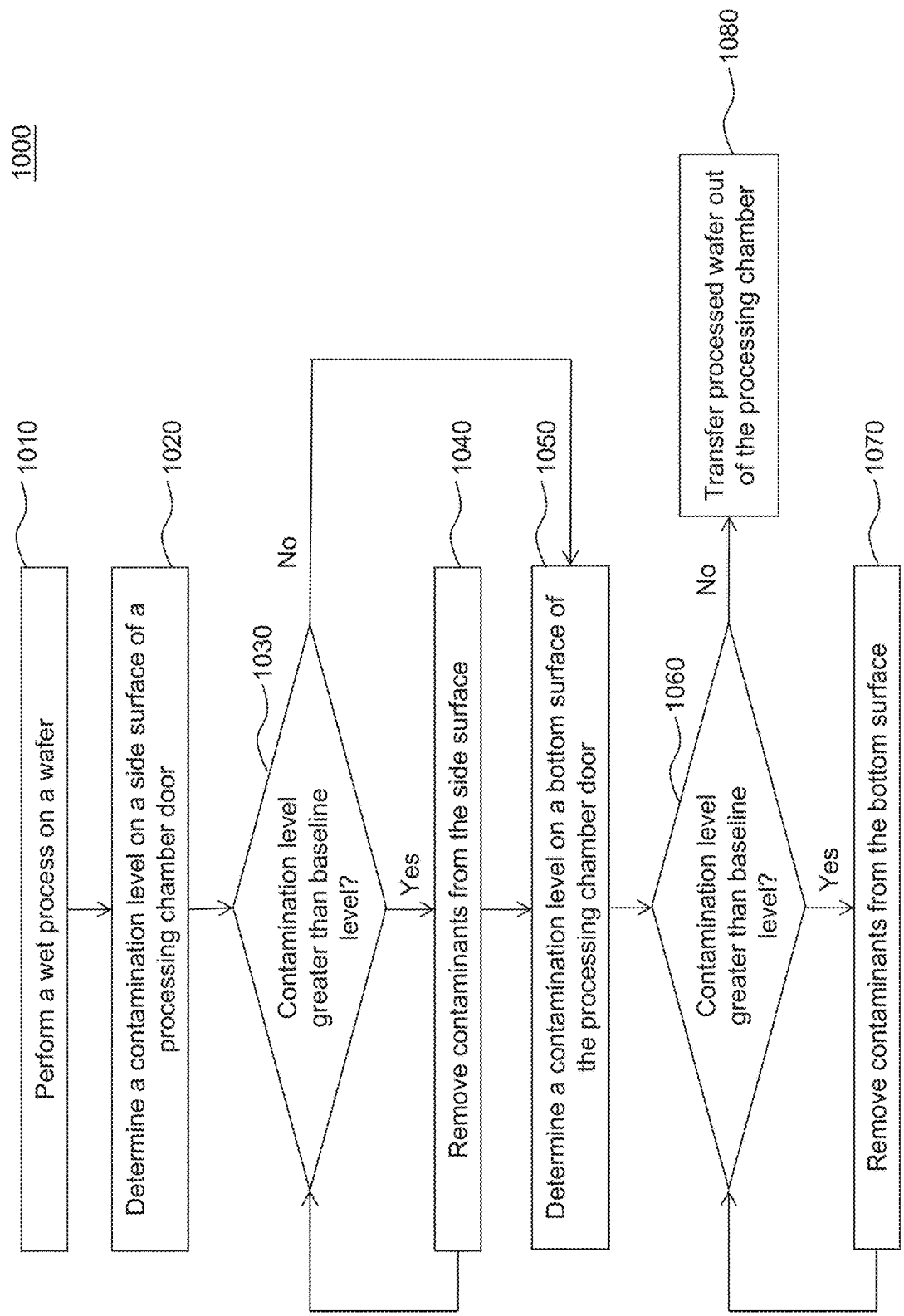
FIG. 10 is a flow chart of a method for detecting and removing contaminants from a processing chamber door of a semiconductor processing system, in accordance with some embodiments.

FIG. 10 is flow diagram of an example method 1000 for detecting and removing contaminants from a processing chamber door of a semiconductor processing system, according to some embodiments. This disclosure is not limited to this operational description. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 10. In some implementations, one or more other operations may be performed in addition to or in place of the presently described operations. For illustrative purposes, method 1000 is described with reference to the embodiments of FIGS. 2-3 and 6-8. However, method 1000 is not limited to these embodiments.

In operation 1010 of FIG. 10, a wet process is performed on a wafer. For example, as shown and discussed with reference to FIG. 2, a wet process can be performed on wafer 104 in semiconductor processing system 200. The wet process can include etching, cleaning, spin coating, developing photoresist, and/or chemical mechanical polishing.

In operation 1020 of FIG. 10, a contamination level on a side surface of a processing chamber door of the semiconductor processing system is determined. For example, as shown and discussed with reference to FIG. 6, a contamination level on side surfaces 202a and/or 202b of processing chamber door 202 can be determined using contamination detection system 640.

In operation 1030 of FIG. 10, the determined contamination level on the side surface is compared to a baseline level. For example, as shown and discussed with reference to FIG. 6, processor 640c of contamination detection system 640 can compare the determined contamination level to the baseline level and output signal 646 indicating whether the contamination level is elevated, equal to, or below the baseline level. If signal 646 indicates an elevated contamination level, then method 1000 can proceed to operation 1040. Otherwise, if signal 646 indicates that the contamination level is not greater than the baseline level, then method 1000 can proceed to operation 1050.

In operation 1040 of FIG. 10, contaminants are removed from the side surface of the processing chamber in response to the contamination level on the side surface being greater than the baseline level. For example, as shown and discussed with reference to FIGS. 2 and 6, contamination removal systems 224a and/or 224b can be used to remove contaminants from surfaces 202a and/or 202b, respectively, in response to signal 646 indicating that the contamination levels on side surfaces 202a and/or 202b are greater than the baseline level. In some embodiments, after the contamination removal process, method 1000 can proceed to operation 1020 to determine the contamination levels on side surfaces 202a and/or 202b. Operations 1020 and 1030 can be repeated until processor 640c outputs signal 646 indicating that the contamination levels on side surfaces 202a and/or 202b are not greater than the baseline level. In that case, method 1000 can proceed to operation 1050.

In operation 1050 of FIG. 10, a contamination level on a bottom surface of the processing chamber door is determined in response to the contamination level on the side surface being not greater than the baseline level. For example, as shown and discussed with reference to FIG. 7, a contamination level on bottom surface 202c of processing chamber door 202 can be determined using contamination detection system 740 in response to signal 646 indicating that the contamination levels on side surfaces 202a and/or 202b are not greater than the baseline level.

In operation 1060 of FIG. 10, the determined contamination level on the bottom surface is compared to a baseline level. For example, as shown and discussed with reference to FIG. 7, processor 740c of contamination detection system 740 can compare the determined contamination level to the baseline level and output signal 746 indicating whether the contamination level is elevated, equal to, or below the baseline level. If signal 746 indicates an elevated contamination level, then method 1000 can proceed to operation 1070. Otherwise, if signal 746 indicates that the contamination level is not greater than the baseline level, then method 1000 can proceed to operation 1080.

In operation 1070 of FIG. 10, contaminants are removed from the bottom surface of the processing chamber in response to the contamination level on the bottom surface being greater than the baseline level. For example, as shown and discussed with reference to FIGS. 7-8, contamination removal system 860 can be used to remove contaminants from bottom surface 202c, in response to signal 746 indicating that the contamination level on bottom surface 202c is greater than the baseline level. In some embodiments, after the contamination removal process, method 1000 can proceed to operation 1050 to determine the contamination level on bottom surface 202c. Operations 1050 and 1060 can be repeated until processor 740c outputs signal 746 indicating that the contamination level on bottom surface 202c is not greater than the baseline level. In that case, method 1000 can proceed to operation 1080.

In operation 1080 of FIG. 10, the processed wafer is transferred out of the processing chamber in response to the contamination level on the bottom surface being not greater than the baseline level. For example, as shown and discussed with reference to FIGS. 7-8, wafer 104 can be transferred out of processing chamber 106 in response to signal 746 indicating that the contamination level on bottom surface 202c is not greater than the baseline level.

In some embodiments, operations 1020 to 1070 can be performed before transferring a wafer into the processing chamber. A wafer can be transferred into the processing chamber in response to signal 746 indicating that the contamination level on bottom surface 202c is not greater than the baseline level.

The present disclosure provides example contamination detection and removal systems configured to prevent and/or substantially eliminate wafer contamination during wafer transfers to and from the processing chambers. In some embodiments, the example contamination detection systems (e.g., contamination detection systems 640 or contamination detection system 750) can be configured to determine the contamination level on the surfaces of the processing chamber doors. Based on the outputs of the contamination detection systems, the contamination removal systems (e.g., contamination removal systems 224, contamination removal system 22b or contamination removal system 860) can be configured to remove the contaminants from the side surfaces (e.g., surfaces 202a or 202b) and/or bottom surfaces (e.g., surface 202c) of the processing chamber doors (e.g., door 202). In some embodiments, contamination detection systems and/or the contamination removal systems can be configured to operate based on the position of the processing chamber doors.

In some embodiments, the contamination removal systems can include contamination removal devices (e.g., gas nozzle 330 or gas nozzle 530) configured to provide gas flow at a high velocity to remove contaminants from the surfaces of the processing chamber doors. The gas flow can be directed at the processing chamber doors at an angle less than 90 degrees with respect to the side surfaces of the processing chamber doors. In some embodiments, contamination removal devices (e.g., device 862) can include wiping elements (e.g., wiping elements 862a) that can be configured to extract contaminants from the bottom surfaces of the processing chamber doors. The example contamination detection and removal systems disclosed herein increase the production yield of semiconductor devices due to a decrease in defective wafers. In some embodiments, the production yield is improved by about 10% to about 50% compared to processing modules without the contamination detection and removal systems.

In some embodiments, a semiconductor processing system includes a processing chamber configured to process a wafer and comprising a door, a contamination detection system configured to determine whether a contamination level on a surface of the door is greater than a baseline level, and a contamination removal system configured to remove contaminants from the surface of the door in response to the contamination level being greater than the baseline level.

In some embodiments, a semiconductor processing system includes a processing chamber configured to process a wafer and comprising a door and a contamination detection system with an infrared (IR) emitter configured to emit a radiation along a surface of the door, an IR detector configured to detect an optical property of a portion of the radiation, and a processor configured to determine a contamination level on the surface based on the optical property. The semiconductor processing system further includes a contamination removal system configured to remove contaminants from the surface based on the contamination level.

In some embodiments, a method for controlling contamination in a semiconductor processing system includes determining whether a contamination level on a side surface of a processing chamber door is greater than a baseline level, removing contaminants from the side surface in response to the contamination level being greater than the baseline level, and transferring the wafer into or out of the processing chamber in response to the contamination level on the side surface or a contamination level on a bottom surface of the processing chamber door being equal to or below the baseline level.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor processing system, comprising:
    a chamber configured to process a wafer and comprising a door;
    a contamination detection system comprising an emitter and a detector configured to determine whether a contamination level on a surface of the door is greater than a baseline level, wherein the emitter and the detector are configured to move substantially simultaneously along the surface of the door; and
    a contamination remover configured to remove contaminants from the surface of the door in response to the contamination level being greater than the baseline level.

2. The semiconductor processing system of claim 1, wherein the contamination detection system is configured to determine the contamination level on a side surface of the door when the door is in a closed position.

3. The semiconductor processing system of claim 1, wherein the contamination detection system is configured to determine the contamination level on a horizontal bottom surface of the door when the door is in an open position.

4. The semiconductor processing system of claim 1, wherein the contamination remover is configured to remove the contaminants from a side surface of the door when the door is in a closed position.

5. The semiconductor processing system of claim 1, wherein the contamination remover is configured to wipe the contaminants off a horizontal bottom surface of the door when the door is in an open position.

6. The semiconductor processing system of claim 1, wherein the emitter is configured to emit a radiation along a surface of the door and the detector is configured to detect an optical property of a portion of the radiation.

7. The semiconductor processing system of claim 1, wherein the emitter is configured to emit a radiation along a first direction, and
    wherein the emitter and the detector are configured to move along a second direction that is substantially perpendicular to the first direction.

8. The semiconductor processing system of claim 1, wherein the contamination remover comprises a gas nozzle configured to discharge a stream of gas to strike a side surface of the door at an incident angle ranging from about 15 degrees to about 75 degrees.

9. The semiconductor processing system of claim 1, wherein the contamination remover comprises an array of wiping elements and supporting elements configured to support a lower portion of each wiping element in the array of wiping elements.

10. A semiconductor processing system, comprising:
    a processing chamber comprising a door and configured to process a wafer;
    a contamination detection system, comprising:
        an emitter configured to emit a radiation along a surface of the door,
        a detector configured to detect an optical property of a portion of the radiation, and a processor configured to determine a contamination level on the surface based on the optical property; and a contamination removal system configured to remove contaminants from the surface based on the contamination level, wherein the contamination removal system comprises an array of wiping elements and supporting elements.

11. The semiconductor processing system of claim 10, wherein the processor is further configured to determine whether the contamination level is greater than a baseline level.

12. The semiconductor processing system of claim 10, wherein the contamination removal system comprises a gas nozzle with a nozzle outlet surface sloped at an angle of about 30 degrees to about 60 degrees with respect to a vertical plane and configured to strike a side surface of the door with a stream of gas at an incident angle ranging from about 15 degrees to about 75 degrees.

13. The semiconductor processing system of claim 10, wherein the detector is further configured to receive the portion of the radiation and detect an intensity of the portion of the radiation.

14. The semiconductor processing system of claim 10, wherein the surface comprises a hydrophobic coating with a water contact angle ranging from about 93 degrees to about 176 degrees.

15. The semiconductor processing system of claim 10, wherein the surface comprises a textured surface with a plurality of cavities.

16. A semiconductor processing system, comprising:
a processing chamber configured to process a wafer and comprising a door;
an emitter configured to emit a radiation along an interior surface and a horizontal bottom surface of the door;
a detector configured to detect an optical property of the radiation;
a processor configured to determine a contamination level on the interior surface and the horizontal bottom surface based on the optical property; and
a contamination removal system configured to remove contaminants from the interior surface and the horizontal bottom surface based on the contamination level.

17. The semiconductor processing system of claim 16, wherein the interior surface comprises a hydrophobic coating.

18. The semiconductor processing system of claim 16, wherein the emitter and the detector are configured to move substantially simultaneously along a vertical direction, and wherein the emitter is configured to emit the radiation in a horizontal direction towards the detector.

19. The semiconductor processing system of claim 16, wherein the detector is configured to detect an intensity of the radiation.

20. The semiconductor processing system of claim 16, wherein the contamination removal system comprises an array of wiping elements and supporting elements.

* * * * *